United States Patent [19]
Kohno

[11] Patent Number: 5,789,800
[45] Date of Patent: Aug. 4, 1998

[54] BIPOLAR TRANSISTOR HAVING AN IMPROVED EPITAXIAL BASE REGION

[75] Inventor: Hiroshi Kohno, Tokyo, Japan

[73] Assignee: NEC Corporation, Tokyo, Japan

[21] Appl. No.: 785,611

[22] Filed: Jan. 17, 1997

[30] Foreign Application Priority Data

Jan. 17, 1996 [JP] Japan ................... 8-005378

[51] Int. Cl.⁶ .................. H01L 27/082; H01L 27/102; H01L 29/70; H01L 31/11
[52] U.S. Cl. .................. 257/588; 257/197; 257/576; 257/592; 257/616
[58] Field of Search .......................... 257/197, 198, 257/576, 588, 592, 616

[56] References Cited

U.S. PATENT DOCUMENTS

| | | | |
|---|---|---|---|
| 5,391,503 | 2/1995 | Miwa et al. | 437/31 |
| 5,523,606 | 6/1996 | Yamazaki | 257/370 |
| 5,569,611 | 10/1996 | Imai | 437/31 |
| 5,629,556 | 5/1997 | Johnson | 257/592 |
| 5,648,280 | 7/1997 | Kato | 437/31 |

*Primary Examiner*—Mahshid D. Saadat
*Assistant Examiner*—Allan R. Wilson
*Attorney, Agent, or Firm*—Young & Thompson

[57] ABSTRACT

A base region structure of a bipolar transistor is provided. The base region structure is formed over both an epitaxial layer having a first conductivity type and an insulation film. The base region structure comprises a single layer having a first conductivity type. The single layer comprises both an epitaxial portion extending over the epitaxial layer and a polycrystal portion extending over the insulation film. An emitter region is formed at an upper part of the epitaxial portion. The epitaxial portion serves as a base region and the polycrystal portion serves as a base plug lead.

4 Claims, 10 Drawing Sheets

5,789,800

1

BIPOLAR TRANSISTOR HAVING AN IMPROVED EPITAXIAL BASE REGION

BACKGROUND OF THE INVENTION

The present invention relates to a semiconductor device and a method of fabricating the same, and more particularly to a bipolar transistor having an improved epitaxial base region and a method of fabricating the same.

In order to improve high frequency and high speed performances of the bipolar transistor, it have been attempted to reduce both lateral and vertical sizes of the bipolar transistor. For example, a molecular beam epitaxy system is useful to form a shallow emitter junction so as to reduce a capacitance of the emitter junction as well as reduce an emitter resistance. Further, a self-alignment technique is also useful to form the bipolar transistor scaled down. One of the conventional method of fabricating the bipolar transistor by use of the molecular beam epitaxy system will hereinafter be described with reference to FIGS. 1A through 1H.

With reference to FIG. 1A, an n$^+$-type silicon substrate 1 is prepared. An n$^-$-type silicon epitaxial layer 2 is formed on the n$^+$-type silicon substrate 1 to form a wafer comprising the n$^+$-type silicon substrate 1 and the n$^-$-type silicon epitaxial layer 2. Field oxide films 3 are selectively formed on the wafer by a spot local oxidation of silicon method. The field oxide films 3 have a top surface of the same level as the top surface of the n$^-$-type silicon epitaxial layer 2 and a bottom surface of a lower level than the interface between the n$^+$-type silicon substrate 1 and n$^-$-type silicon epitaxial layer 2. A surface silicon oxide film 4 is formed which extends over the top surface of the n$^-$-type silicon epitaxial layer 2 and the field oxide films 3. p$^+$-type layers 18 are selectively formed in an upper portion of the n$^-$-type silicon epitaxial layer 2 by ion-implantation method. The surface silicon oxide film 4 is selectively removed by a photo-lithography method and an anisotropic etching method to selectively leave the surface silicon oxide film 4 over the field oxide films 3 and the vicinity portion of the n$^-$-type silicon epitaxial layer 2 to the field oxide films 3.

With reference to FIG. 1B, a silicon molecular beam epitaxy system is used to cause a crystal growth of silicon doped with a p-type impurity over an entire surface of the wafer whereby a p-type epitaxial layer 5 is grown over the n$^-$-type silicon epitaxial layer 2 and simultaneously a p-type polysilicon layer 6 is formed over the surface silicon oxide film 4.

With reference to FIG. 1C, a photo-resist film is applied over the entire surface of the wafer and then patterned by a photo-lithography method to leave a photo-resist film 9j over the p-type epitaxial layer 5 and adjacent portions of the p-type polysilicon layer 6 to the p-type epitaxial layer 5. An anisotropic etching is carried out by use of the photo-resist film 9j as a mask to selectively remove the p-type polysilicon layer 6 from the wafer whereby the p-type epitaxial layer 5 and adjacent portions of the p-type polysilicon layer 6 to the p-type epitaxial layer 5 remain over the wafer.

With reference to FIG. 1D, the photo-resist film 9j is removed from the wafer. An insulation film 19 made of silicon oxide or silicon nitride is deposited on an entire surface of the wafer by a chemical vapor deposition method so that the insulation film 19 extends over the p-type epitaxial layer 5, the remaining portions of the p-type polysilicon layer 6 and the surface silicon oxide film 4.

With reference to FIG. 1E, the insulation film 19 is selectively etched by a photo-lithography method and an anisotropic etching method to form base contact recesses in the insulation film 19 at base contact portions 15 which are positioned over the p$^+$-type layers 18 as well as form an emitter contact recess in the insulation film 19 at an emitter contact portion 22. Under the base contact recesses and the emitter contact recess, the insulation film 19 has a several tens nanometers. The emitter contact recess of the insulation film 19 is further etched by a photo-lithography method and an anisotropic etching method to form an emitter contact hole 22 so that the p-type epitaxial layer 5 is shown via the emitter contact hole 22.

With reference to FIG. 1F, a polysilicon film 12 is deposited on an entire surface of the wafer by a chemical vapor deposition method so that the polysilicon film 12 extends over the insulation film 19 and within the base recesses and the emitter contact hole of the insulation film 19 whereby the polysilicon film 12 in the emitter contact hole 22 is in contact with the surface of the p-type epitaxial layer 5. The polysilicon film 12 is doped with an n-type impurity by an ion implantation before the wafer is subjected to an annealing so as to cause a thermal diffusion of the n-type impurity from the polysilicon film 12 in the emitter contact hole 22 into the p-type epitaxial layer 5 whereby an n-type emitter region 14 is formed in an upper portion of the p-type epitaxial layer 5 wherein this upper portion is a portion which is in contact with the polysilicon film 12 residing in the emitter contact hole 22. This annealing process further causes an activation of the p$^+$-type layers 18.

With reference to FIG. 1G, the polysilicon film 12 is selectively removed by a photo-lithography method and an anisotropic etching method so as to selectively leave the polysilicon film 12 within and around the emitter contact hole 22. The insulation film 19 under the base recess portions 15 is farther selectively etched by an anisotropic etching so that base contact holes 15 are formed over the p$^+$-type layers 18 whereby the p$^+$-type layers 18 are shown via the base contact holes 15.

With reference to FIG. 1H, a barrier metal layer 16 is formed on an entire surface of the wafer by an evaporation so that the barrier metal layer 16 extends over the insulation film 19 and the polysilicon film 12 as well as within the base contact holes 15 whereby the barrier metal layer 16 in the base contact holes 15 is in contact with the p$^+$-type layers 18. Electrodes 17 are selectively formed on the barrier metal layer 16 and over the p$^+$-type layers 18 by a photo-lithography method and a plating method wherein the electrodes 17 are defined by a photo-resist pattern not shown in FIG. 1H and formed by that photo-lithography method. After the electrodes 17 have been formed, the photo-resist pattern is removed from the wafer. The barrier metal layer 16 is selectively removed by an anisotropic etching method which uses the electrodes 17 as masks so that the barrier metal layer 16 remains only under the electrodes 17 or within and around the base contact holes over the p$^+$-type layers 18. As a result, the bipolar transistor is completed.

The above conventional method of fabricating the bipolar transistor has the following serious problems with difficulty to form the emitter contact hole 22 and the base recess at the base contact portion 15. Namely, it is required to etch the insulation film 19 with a very small difference in etching depth between the base contact portion 15 and the emitter contact portion 22 as illustrated in FIG. 1E. When the isotropic etching were used to form the emitter contact 22, a side etching appears on the insulation film 19, resulting in an undesirable increase in emitter area. This means that the distance of the emitter region from the p$^+$-type layer 18 is shortened whereby a DC property of the bipolar transistor is deteriorated.

Further, as described above, the insulation film 19 under the base recesses 15 has a small thickness, for example, a several tens nanometers. This thin portions of the insulation film 19 serve as a protection layer for the base interfaces from the anisotropic etching which is carried out to selectively remove the n-type polysilicon film 12 as described above and also illustrated in FIG. 1G. Actually, however, the thickness of the insulation film 19 under the base recesses 15 is likely to be varied slightly due to an unavoidable small variation in depth of the etching. If, for example, the thickness of the insulation film 19 under the base recesses 15 is somewhat reduced from the predetermined value, then there may be raised a problem with over-etching to the insulation film 19 under the base recesses 15 in the process for selectively etching and removing the polysilicon film 12. Namely, the surface of the $p^+$-type layer 18 may be etched by selectively etching and removing the polysilicon film 12. The etching of the $p^+$-type layer 18 having a high impurity concentration causes the base resistance to be risen, resulting in deterioration in DC property and RF property.

For the above described conventional method of forming the bipolar transistor, such very precise etching technique free of variation in etching depth and area is required in order to prevent deterioration in DC property and RF property as well as other performances of the bipolar transistor. Notwithstanding, it has been difficult to carry out the etching process free of any practical variation in etching depth and area.

Further, the above bipolar transistor has a difficulty to reduce the scale thereof for the following reasons. It is essential to provide the $p^+$-type layer 18 as the base plug in the base region. In the light of the issue of an actual discrepancy in alignment to the base contact, it is difficult to reduce the size of the $p^+$-type layer 18 as the base plug formed in the base region. Further, in the lights of the necessity to keep the minimum withstand voltage between the emitter and base as well as of the necessary margin against the discrepancy in alignment and the difficulty to reduce the size of the $p^+$-type layer 18, it is difficult to reduce a distance between the base contact and the emitter contact, for which reason it is difficult to reduce the scale of the base region.

The $p^+$-type layer 18 extends to a deep level in the collector region. This results in increases in the base-collector junction capacitance. Since it is difficult to reduce the scale of the base region, it is also difficult to reduce the parasitic capacitance. This means that it is difficult to obtain the required shallow junction effects.

First one of the conventional bipolar transistors formed by use of the self-alignment technique will be described with reference to FIG. 2. This conventional bipolar transistor is disclosed in the Japanese laid-open patent publication No. 61-290761.

The conventional bipolar transistor is formed on a p-type silicon substrate 201. An $n^+$-type buried layer 202 is formed over the p-type silicon substrate 201. An $n^-$-type epitaxial layer 203 is formed over the $n^+$-type buried layer 202. The laminations of the p-type silicon substrate 201, the $n^+$-type buried layer 202 and the $n^-$-type epitaxial layer 203 form a wafer. Field oxide films 204 are selectively formed on a surface of the $n^-$-type epitaxial layer 203 which surrounds an active region. A p-type base region 210 is formed at the center position in the active region of the $n^-$-type epitaxial layer 203. In the active region of the $n^-$-type epitaxial layer 203, a p-type semiconductor region 211 is further provided, which extends to surround the p-type base region 210. In the active region of the $n^-$-type epitaxial layer 203, a $p^+$-type semiconductor region 212 is furthermore provided, which extends to surround the p-type semiconductor region 211. An $n^+$-type emitter region 213 is formed over the p-type base region 210. A $p^+$-type polysilicon film 205 acting as a base plug lead is formed, which extends over the $p^+$-type semiconductor region 212 and the field oxide films 204. Part of the $p^+$-type polysilicon film 205 is in contact with the top surface of the $p^+$-type semiconductor region 212 so that the $p^+$-type polysilicon film 205 is connected via the $p^+$-type semiconductor region 212 and the p-type semiconductor region 211 to the p-type base region 210. A boron silicate glass film 207 is formed over the p-type semiconductor region 211 expect over the $n^+$-type emitter region 213. A silicon nitride film 206 is further formed, which extends over the boron silicate glass film 207 and part of the $p^+$-type polysilicon film 205. Over the $n^+$-type emitter region 213, an $n^+$-type polysilicon film 208 is formed, which is in contact with the top surface of the $n^+$-type emitter region 213 so that $n^+$-type polysilicon film 208 serves as an emitter plug lead. The $n^+$-type polysilicon film 208 serving as the emitter plug lead is electrically isolated by the boron silicate glass film 207 and the silicon nitride film 206 from the $p^+$-type polysilicon film 205 serving as the base plug lead. Base electrodes 209 are formed over the $p^+$-type polysilicon film 205 serving as the base plug lead. An emitter electrode 209 is also formed over the $n^+$-type polysilicon film 208 serving as the emitter plug lead.

The above bipolar transistor structure is somewhat suitable for scaling down in the lateral direction of the bipolar transistor as compared to the conventional shallow junction bipolar transistor. Such scaling down in the lateral direction of the bipolar transistor may provide an improvement in the high frequency performance of the bipolar transistor.

Notwithstanding, the structure thereof is too complicated and the fabrication processes are also so complicated. Further, there are essential one or more processes to be carried out under a very precise control of the process conditions, for which reason it is difficult to obtain a high yield of the manufacturing of the bipolar transistor. For example, it is required to carry out an isotropic etching by use of a liquid chemical or etchant in order to form an over-hang shape. It is difficult to precisely control the etching rate of the isotropic etching by use of a liquid chemical or etchant. It is further difficult to suppress variation in the chemical concentration which provides a substantial influence to the etching rate, resulting in variation in the etching rate. The variation in the etching rate causes variations in the base resistance and in the distance between the emitter region and the base region whereby it is difficult to obtain a high yield of manufacturing of the bipolar transistor.

Second one of the conventional bipolar transistors formed by use of the self-alignment technique will be described with reference to FIG. 3. This conventional bipolar transistor is disclosed in the Japanese laid-open patent publication No. 5-315347.

The conventional bipolar transistor is formed on a p-type silicon substrate 301. An $n^+$-type buried layer 302 is formed over the p-type silicon substrate 201. An n-type well layer 303 is selectively formed in an upper portion of the $n^+$-type buried layer 302. Field oxide films 304 are selectively formed on a surface of the wafer to define active regions. A p-type base region 310 is formed at a center region in the active region of the n-type well layer 303. In the active region of the n-type well layer 303, a $p^+$-type semiconductor region 312 is further provided, which extends to surround the p-type base region 310. The p$^+$-type semiconductor region 312 is surrounded by the field oxide film 304. An n$^+$-type emitter region 311 is selectively formed in an upper region of the p-type base region 310 so that the n$^+$-type emitter region 311 is separated by the p-type base region 310 from the p$^+$-type semiconductor region 312. A p$^+$-type polysilicon film 305 acting as a base plug lead is formed, which extends over the p$^+$-type semiconductor region 312 and the field oxide films 304. Part of the p$^+$-type polysilicon film 305 is in contact with the top surface of the p$^+$-type semiconductor region 312 so that the p$^+$-type polysilicon film 305 is connected via the p$^+$-type semiconductor region 312 to the p-type base region 310. An n$^+$-type polysilicon film 308 is formed over the wafer which extends to be in contact with the n$^+$-type emitter region 311 so that the n$^+$-type polysilicon film 308 serves as an emitter plug lead as well as extends to be in contact with the n$^+$-type buried layer 302 so that the n$^+$-type polysilicon film 308 serves as a collector plug lead. A silicon oxide film 306 is formed, which extends over the p$^+$-type polysilicon film 305 and the n$^+$-type polysilicon film 308. A boron phosphate silicate glass film 307 is formed, which extends over the silicon oxide film 306. Contact holes are formed in the laminations of the silicon oxide film 306 and the boron phosphate silicate glass film 307. Electrodes 309 are formed in the contact holes so that the electrodes 309 are in contact with the n$^+$-type polysilicon films 308 serving as the collector plug lead and the emitter plug lead as well as in contact with the p$^+$-type polysilicon film 305 serving as the base plug lead.

The above bipolar transistor structure is somewhat suitable for scaling down in the lateral direction of the bipolar transistor as compared to the conventional shallow junction bipolar transistor. Such scaling down in the lateral direction of the bipolar transistor may provide an improvement in the high frequency performance of the bipolar transistor.

Notwithstanding, the structure thereof is too complicated and the fabrication processes are also so complicated. Further, there are essential one or more processes to be carried out under a very precise control of the process conditions, for which reason it is difficult to obtain a high yield of the manufacturing of the bipolar transistor. For example, it is required to carry out a peripheral etching which utilizes a difference in etching reactivity to molybdenum due to a difference in oxygen concentration of the reaction gases. It is difficult to precisely control the etching rate of the isotropic etching by use of a liquid chemical or etchant. It is further difficult to suppress variation in the chemical concentration which provides a substantial influence to the etching rate, resulting in variation in the etching rate. The variation in the etching rate causes variations in the base resistance and in the distance between the emitter region and the base region whereby it is difficult to obtain a high yield of manufacturing of the bipolar transistor.

In the above circumstances, it had been required to develop a novel bipolar transistor free from the problems as described above as well as a method of fabricating the bipolar transistor, which is free from the complicated processes and any process which is hard to be precisely controlled.

SUMMARY OF THE INVENTION

Accordingly, it is an object of the present invention to provide a novel bipolar transistor with an improved base region structure free of any problems as described above.

It is a further object of the present invention to provide a novel bipolar transistor with an improved base region structure which allows an improvement in high frequency and high speed performances.

It is a furthermore object of the present invention to provide a novel bipolar transistor with an improved base region structure which allows the bipolar transistor to process an improved DC property.

It is a furthermore object of the present invention to provide a novel bipolar transistor with an improved base region structure which allows the bipolar transistor to process an improved RF property.

It is a still further object of the present invention to provide a novel bipolar transistor with an improved base region structure substantially scaled down.

It is yet a further object of the present invention to provide a novel bipolar transistor having a simple structure.

It is another object of the present invention to provide a novel method of forming a bipolar transistor, which comprises simple fabrication processes.

It is another object of the present invention to provide a novel method of forming a bipolar transistor, which do not include any process to be carried under conditions which are hard to be precisely controlled.

It is still another object of the present invention to provide a novel method of forming a bipolar transistor, which comprises only facilitated processes without, however, including any process to be carried under conditions which are hard to be precisely controlled.

It is yet another object of the present invention to provide a novel method of forming a bipolar transistor, which allows the formed bipolar transistor to be free of substantial variations in properties.

It is further another object of the present invention to provide a novel method of forming a bipolar transistor, which allows a high yield of manufacturing the bipolar transistor.

It is moreover object of the present invention to provide a novel method of forming a bipolar transistor, which comprises a reduced number of the fabrication processes.

It is still more object of the present invention to provide a novel method of forming a bipolar transistor, which comprises a reduced number of the fabrication processes.

It is an additional object of the present invention to provide a novel method of forming a bipolar transistor, which allows the formed bipolar transistor to be free of substantial variations in dimensions and scales.

It is a further additional object of the present invention to provide a novel method of forming a bipolar transistor, which allows a reduction in manufacturing cost of the bipolar transistor.

It is yet an additional object of the present invention to provide a novel method of forming a bipolar transistor, which allows a reduction in manufacturing time of the bipolar transistor.

The above and other objects, features and advantages of the present invention will be apparent from the following descriptions.

The present invention provides a base region structure of a bipolar transistor. The base region structure is formed over both an epitaxial layer having a first conductivity type and an insulation film. The base region structure comprises a single layer having a second conductivity type. The single layer comprises both an epitaxial portion extending over the epitaxial layer and a polycrystal portion extending over the insulation film. An emitter region is formed at an upper part of the epitaxial portion. The epitaxal portion serves as a base region and the polycrystal portion serves as a base plug lead.

The present invention also provides a method of forming a base region structure of a bipolar transistor. The method comprises a single step of growing a single layer having a first conductivity type, wherein the single layer comprises both an epitaxial portion extending over an epitaxial layer and a polycrystal portion extending over an insulation film, and wherein the epitaxial portion serves as a base region and the polycrystal portion serves as a base plug lead.

BRIEF DESCRIPTION OF THE DRAWINGS

Preferred embodiments according to the present invention will be described in detail with reference to the accompanying drawings.

DISCLOSURE OF THE INVENTION

Figure 1A:
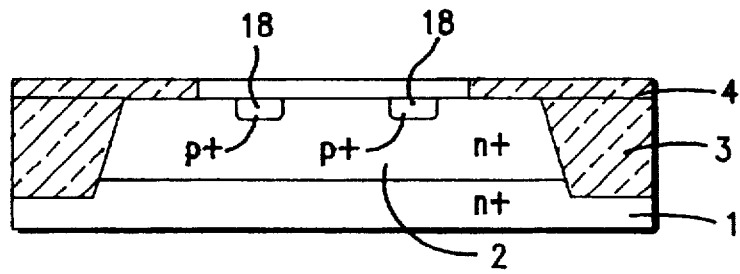
FIGS. 1A through 1H are fragmentary cross sectional elevation views illustrative of the conventional bipolar transistors with a shallow junction structure, involved in the conventional fabrication method thereof.
Figure 1B:
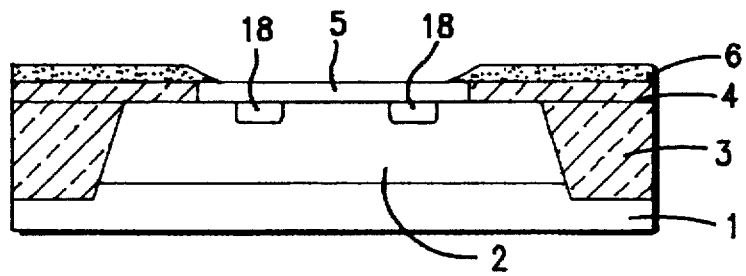
Figure 1C:
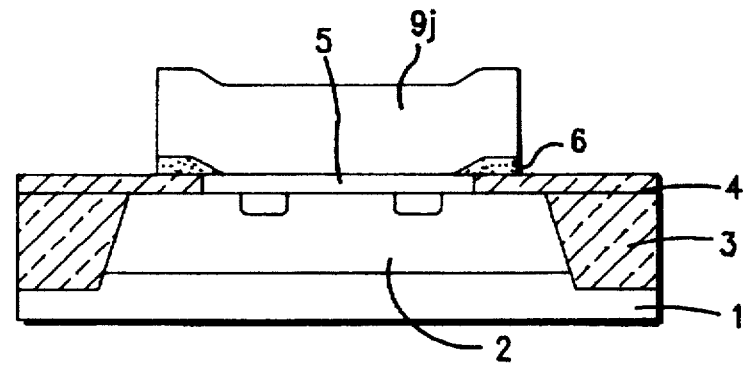
Figure 1D:
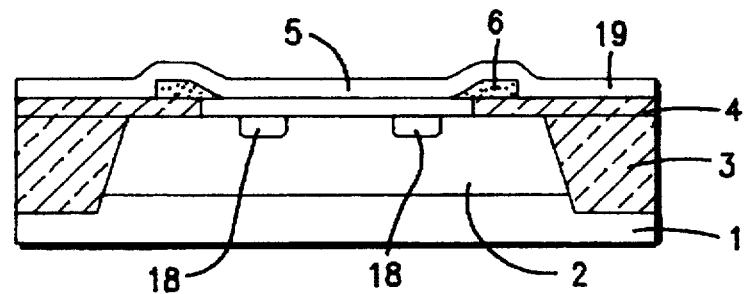
Figure 1E:
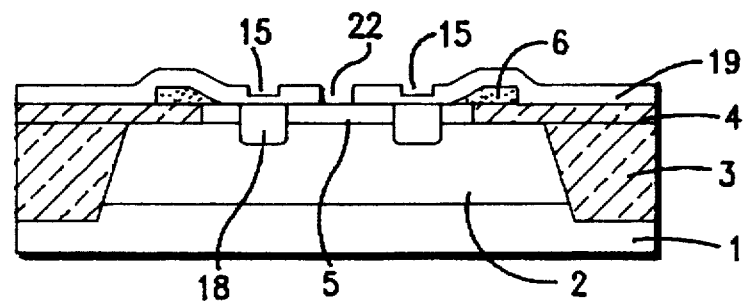
Figure 1F:
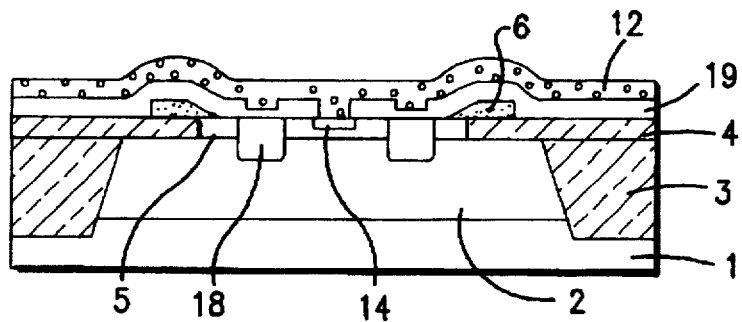
Figure 1G:
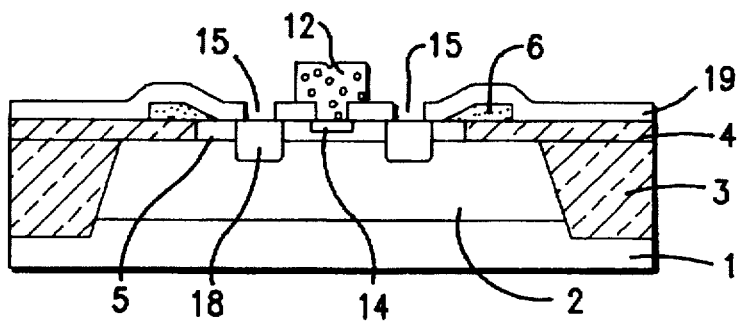
Figure 1H:
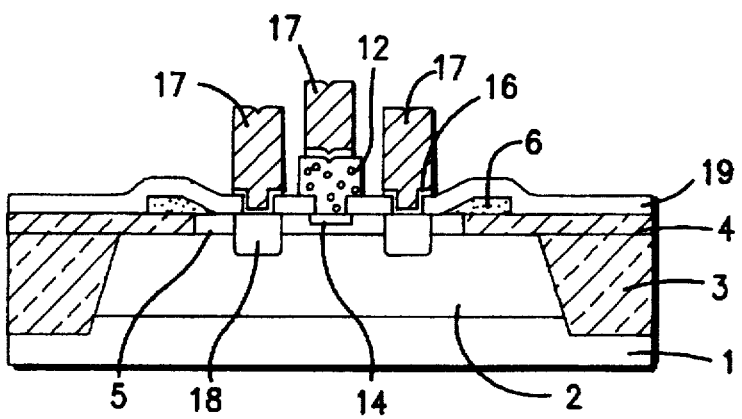
Figure 2:
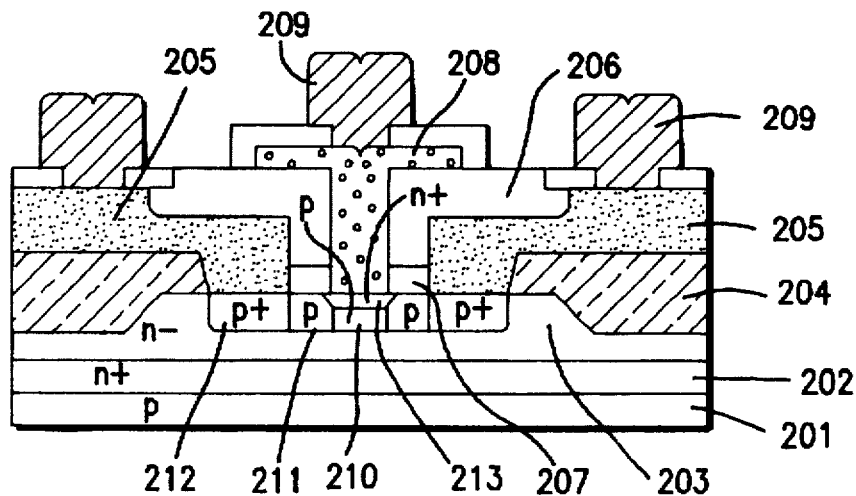
FIG. 2 is a fragmentary cross sectional elevation view illustrative of the conventional bipolar transistor which has been formed by use of a self-alignment technique.
Figure 3:
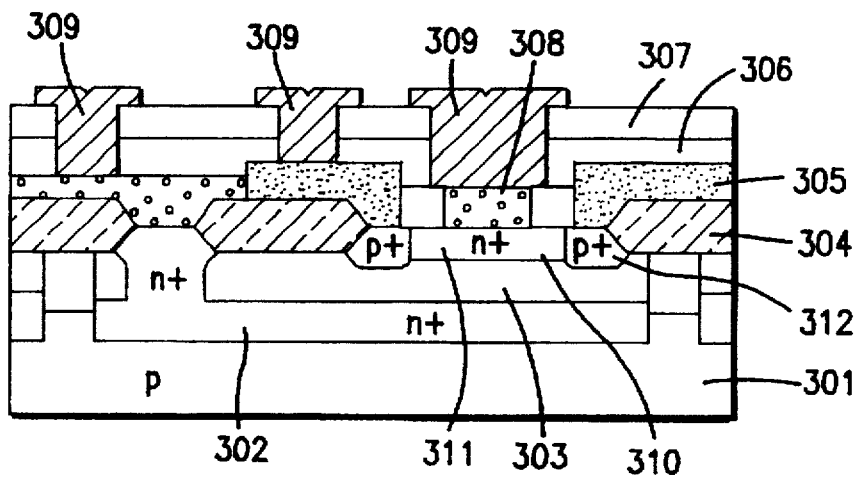
FIG. 3 is a fragmentary cross sectional elevation view illustrative of the other conventional bipolar transistor which has been formed by use of a self-alignment technique.
Figure 4:
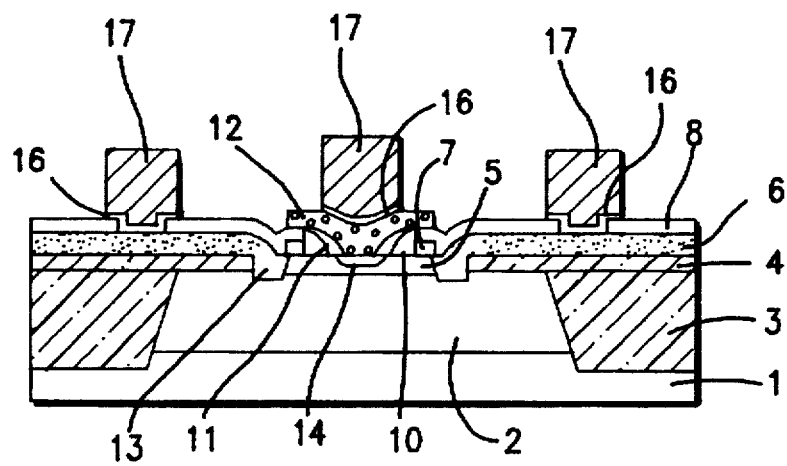
FIG. 4 is a fragmentary cross sectional elevation view illustrative of a novel bipolar transistor with an improved base region structure in a first embodiment according to the present invention.

A first embodiment of the present invention will be described with reference to FIG. 4 illustrative of a novel bipolar transistor with an improved base region structure as well as to FIGS. 5A through 5L illustrative of a novel bipolar transistor with an improved base region structure.

A novel bipolar transistor is formed on an $n^+$-type silicon substrate 1. An $n^-$-type epitaxial layer 2 is formed on the $n^+$-type silicon substrate 1. Laminations of the $n^+$-type silicon substrate 1 and the $n^-$-type epitaxial layer 2 form a wafer. Field oxide film 3 is selectively formed on a top surface of the $n^-$-type epitaxial layer 2 to define an active region. A surface oxide film 4 is formed over the field oxide film 3 and over part of the $n^-$-type epitaxial layer 2. The surface oxide film 4 has a base opening which is positioned over a base formation region of the $n^-$-type epitaxial layer 2 on which a base layer is formed. Namely, the $n^-$-type epitaxial layer 2 is shown via the base opening of the surface oxide film 4. A p-type epitaxial layer 5 serving as a base region is formed over the $n^-$-type epitaxial layer 2. A p-type polysilicon film 6 serving as a base plug layer is formed over the surface oxide film 4. The p-type epitaxial layer 5 and the p-type polysilicon film 6 comprises a single layer which has been grown in a single silicon growth process. The silicon layer grown over the silicon oxide film is a polysilicon layer whilst the silicon layer grown over the silicon epitaxial layer is a silicon epitaxial layer. A silicon oxide film 7 is formed on a peripheral region of the base region 5. A boron silicate glass film 8 is formed over the p-type polysilicon film 6. The boron silicate glass film 8 has an opening which is positioned over the epitaxial layer 5 as the base region. Side wall is formed on the side of the opening wherein the side wall comprises a silicon oxide film 10 and a silicon nitride film 11. An $n^+$-type emitter region 14 is formed in an upper region of the epitaxial base layer 5. An $n^+$-type polysilicon film 12 is formed on the $n^+$-type emitter region 14 and within the opening. A $p^+$-type layer 13 is formed at the boundary region between the epitaxial base layer 5 and the p-type polysilicon film 6. The boron silicate glass film 8 has further base contact holes over the p-type polysilicon film 6. Base electrodes 17 are formed on barrier metal layers 16 which are formed within the base contact holes and on the p-type polysilicon film 6. Further. An emitter electrode 17 is formed on an emitter barrier metal layer 16 which is formed on the $n^+$-type polysilicon film 12.

The above epitaxial base layer 5 and the p-type polysilicon film 6 serving as the base plug lead are formed unitary and simultaneously by a molecular beam epitaxy. This makes it possible to precisely control the impurity concentration and the thickness of the epitaxial base layer 5 without any variation thereof. It is easy to obtain or form a shallow junction structure which causes the shallow junction effects. The epitaxial base layer 5 and the p-type polysilicon film 6 serving as the base plug lead forms a single layer, for which reason it is not necessary to form any base contact region in the base region. This allows reduction in lateral size of the base region, resulting in a reduction in parasitic capacitance.

A fabrication method for the above novel bipolar transistor with an improved base region structure will be described with reference to FIGS. 5A through 5L.

Figure 5A:
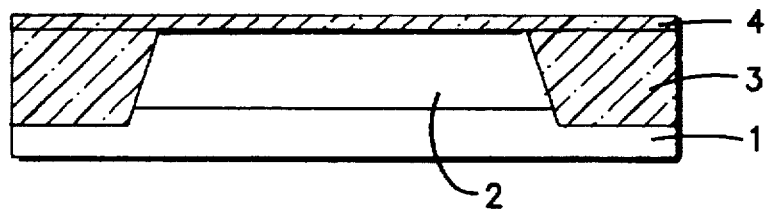
FIGS. 5A through 5L are fragmentary cross sectional elevation views illustrative of a novel bipolar transistor with an improved base region structure in a first embodiment according to the present invention.

With reference to FIG. 5A, an $n^-$-type epitaxial layer 2 is formed on an $n^+$-type silicon substrate 1 to form a wafer. By a spot local oxidation of silicon, field oxide films 3 are formed for subsequent formation of a surface oxide film 4 by a thermal oxidation of silicon.

Figure 5B:
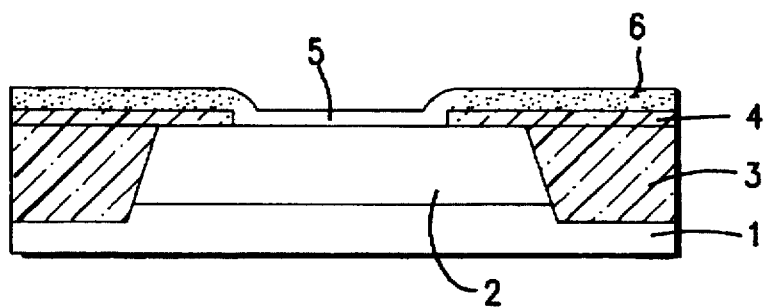

With reference to FIG. 5B, the surface oxide film 4 is selectively removed by a photo-lithography and an anisotropic etching or an isotropic etching to form openings over a base formation region. Subsequently. A silicon molecular beam epitaxy system is used to grow a p-type silicon layer wherein the p-type silicon layer over the $n^-$-type epitaxial layer 2 is a p-type epitaxial layer 5 serving as a base region and the p-type silicon layer over the surface silicon oxide film 4 is a p-type polysilicon layer 6. The p-type epitaxial layer 5 and the p-type polysilicon layer 6 are unitary and simultaneously formed.

Figure 5C:
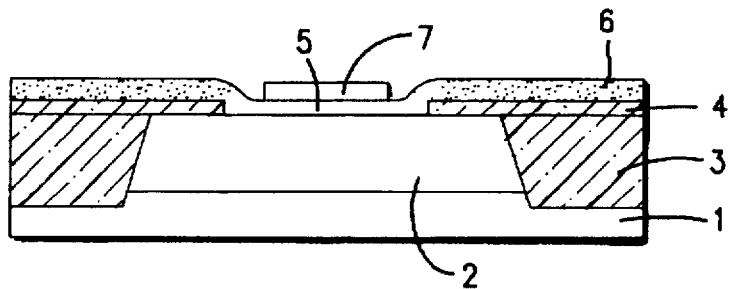

With reference to FIG. 5C, a chemical vapor deposition is used o deposit a silicon oxide film 7 for subsequent photo-lithography and an anisotropic etching to leave the silicon oxide film 7 only within the base region.

Figure 5D:
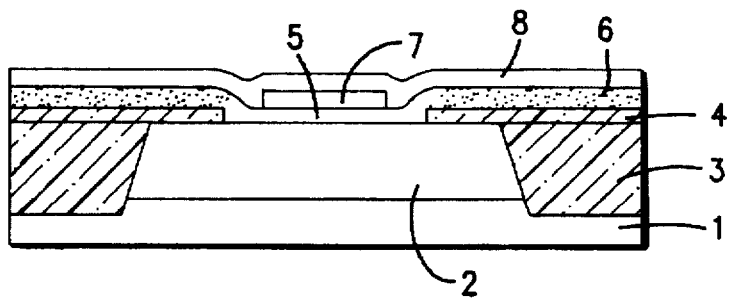

With reference to FIG. 5D, a boron silicate glass film 8 is deposited on an entire surface of the wafer.

Figure 5E:
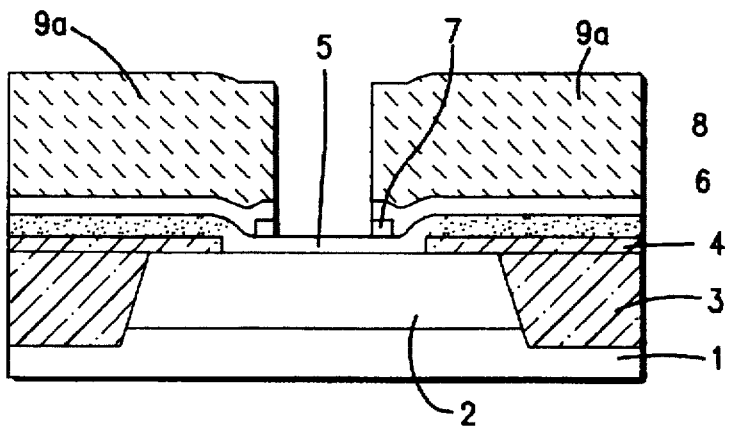

With reference to FIG. 5E. a photo-resist film 9a is formed by a photo-lithography method for use as a mask in an anisotropic etching to selectively remove the boron silicate glass film 8 and the silicon oxide film 7 from the emitter region.

Figure 5F:
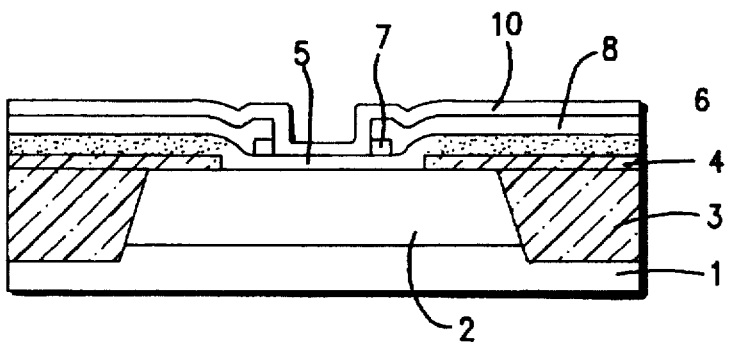

With reference to FIG. 5F, the photo-resist film 9a is then removed before a silicon oxide film 10 is deposited on an entire surface of the wafer by a chemical vapor deposition method.

Figure 5G:
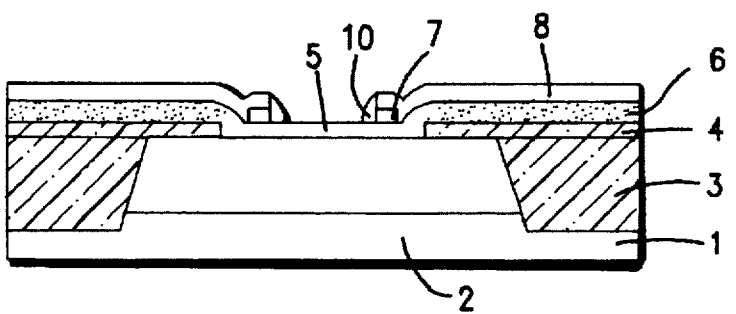

With reference to FIG. 5G, an anisotropic etching is used for etch-back to the silicon oxide film 10 so that side wall of the silicon oxide film 10 is formed at the emitter contact portion.

Figure 5H:
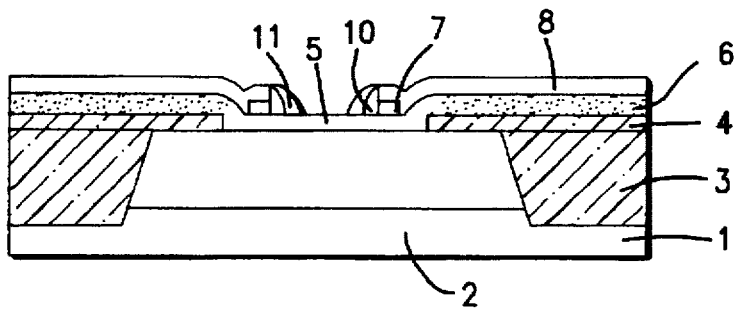

With reference to FIG. 5H, a silicon nitride film 11 is deposited over an entire surface of the wafer for subsequent etch-back thereto by an anisotropic etching method to form a side wall of the silicon nitride film 11.

Figure 5I:
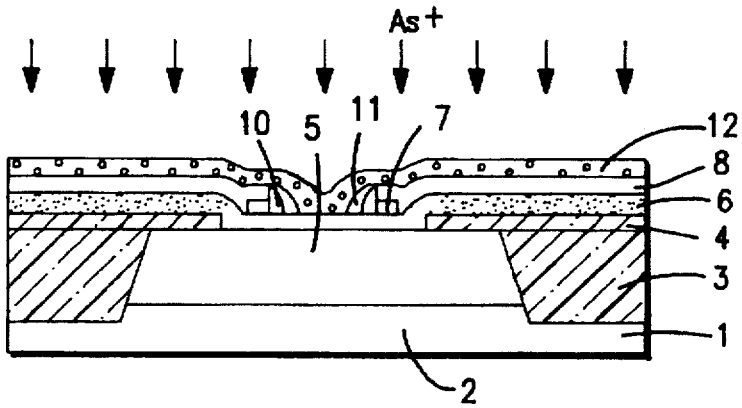

With reference to FIG. 5I, a polysilicon film is deposited by a chemical vapor deposition method for subsequent doping of an n-type impurity by an ion-implantation method at a high impurity concentration to form an $n^+$-type polysilicon film 12.

Figure 5J:
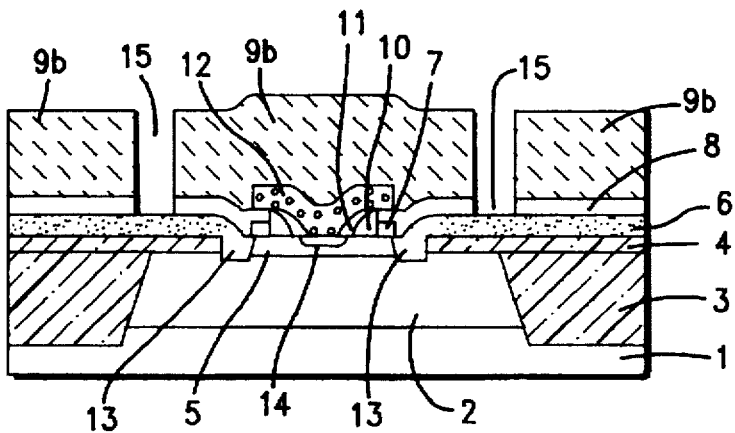

With reference to FIG. 5J, an annealing is carried out for activation of the n-type impurity in the $n^+$-type polysilicon film 12 whereby the n-type impurity in the $n^+$-type polysilicon film 12 is diffused into an upper portion of the p-type epitaxial base layer 5 to thereby form an $n^+$-type emitter region 14. By this annealing, the boron silicate glass film 8 is made into the same film as the silicon oxide film. Further, a diffusion of the p-type impurity into the -type polysilicon film 6 is caused to reduce the sheet resistance of the p-type polysilicon film 6. Furthermore, a diffusion of p-type impurity from the p-type polysilicon film 6 is caused whereby a $p^+$-type layer is formed in the base region. The polysilicon film 12 is selectively removed by a photo-lithography and an anisotropic etching to form an emitter plug of the polysilicon film 12. A photo-resist film 9b is formed by a photo-lithography for subsequent anisotropic etching to selectively remove the boron silicate glass film 8 from the base lead contact portion.

As a modification, it is possible that the polysilicon film 12 is etched before the annealing process is carried out.

Figure 5K:
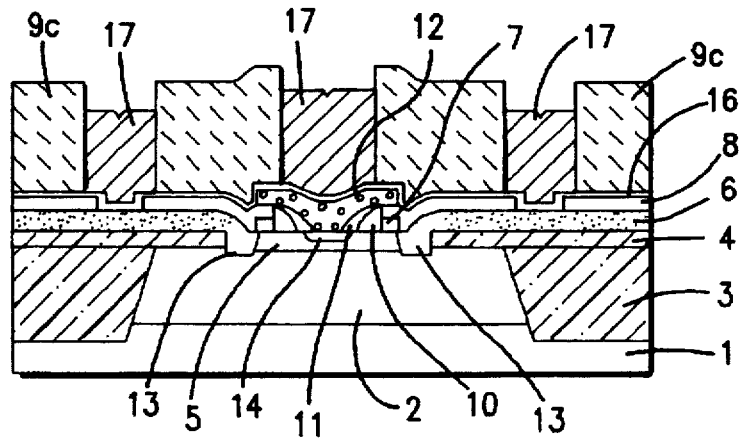

With reference to FIG. 5K, the photo-resist film 9b is removed before a barrier metal film 16 is evaporated on an entire surface of the wafer to form a photo-resist film 9c except on the predetermined electrode formation regions so that electrodes 17 are formed by a plating method.

Figure 5L:
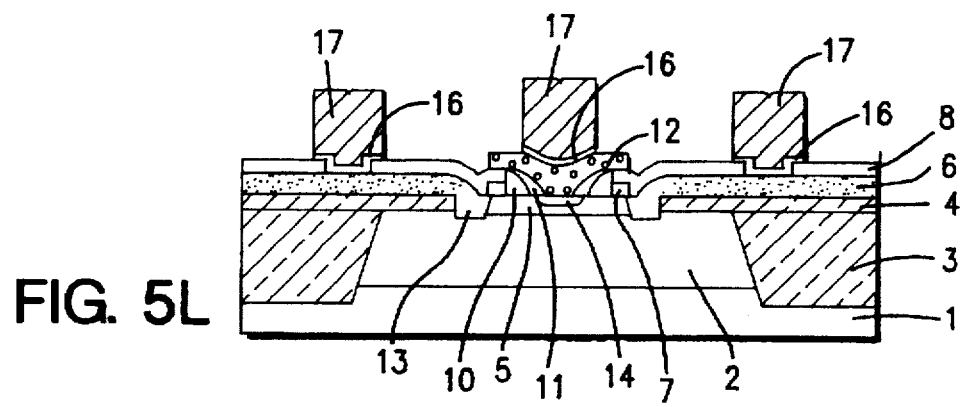

With reference to FIG. 5L, the photo-resist film 9c is removed for subsequent anisotropic etching by use of the electrodes 17 as masks to selectively remove the barrier metal layer 16 except under the electrodes whereby the fabrication processes are completed.

As described above, in accordance with the present invention, it is not necessary to carry out any process under any strict control to the process conditions, for which reason it is possible to suppress variations in dimension or size of the base region structure and other regions or layers, resulting on a high yield being obtained.

The base region and the base plug lead are unitary and simultaneously formed, for which reason it is not necessary to form a base contact in the base region. This makes it possible to reduce the size of the base region, resulting in an improvement in high frequency performance of the bipolar transistor.

The base region 5 and the base plug lead are unitary and simultaneously formed and the boron phosphate glass film supplies the -type impurity into the base plug lead 6, resulting in a reduction in the number of the photo-lithography processes as compared to the conventional one. This allows a reduction in the manufacturing cost and time for the bipolar transistor.

Figure 6:
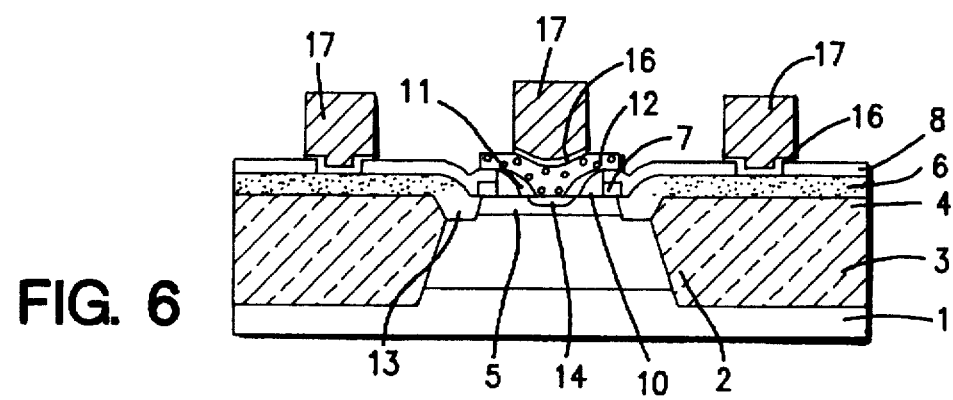
FIG. 6 is a fragmentary cross sectional elevation view illustrative of a novel bipolar transistor with an improved base region structure in a second embodiment according to the present invention.

A second embodiment of the present invention will be described with reference to FIG. 6 illustrative of a novel bipolar transistor with an improved base region structure. A structural difference of the bipolar transistor of the second embodiment from that of the first embodiment is as follows. The field oxide film 3 defines the active region. A difference in the fabrication process of the second embodiment from the first embodiment is as follows. In the same manner as in the first embodiment, the field oxide film is formed for subsequent formation of the surface oxide film 4 before an isotropic etching is carried out to remove the surface oxide film 4 from the active region.

As a modification, it is possible to eliminate the formation of the surface oxide film. After the field oxide film was formed, an isotropic etching is used to remove the oxide film from the active region. The subsequent processes are the same as in the first embodiment.

According to the second embodiment, since it is not necessary to carry out a photo-lithography process for formation of the opening on the base formation region, it is possible to reduce the number of the photo-lithography processes. Further, an area of the interface between the collector and the base is reduced, for which reason a collector-base junction capacitance is reduced. Furthermore, it is possible to reduce the capacitance between the collector and the base plug lead, resulting in further improvement in the performance of the bipolar transistor.

Figure 7:
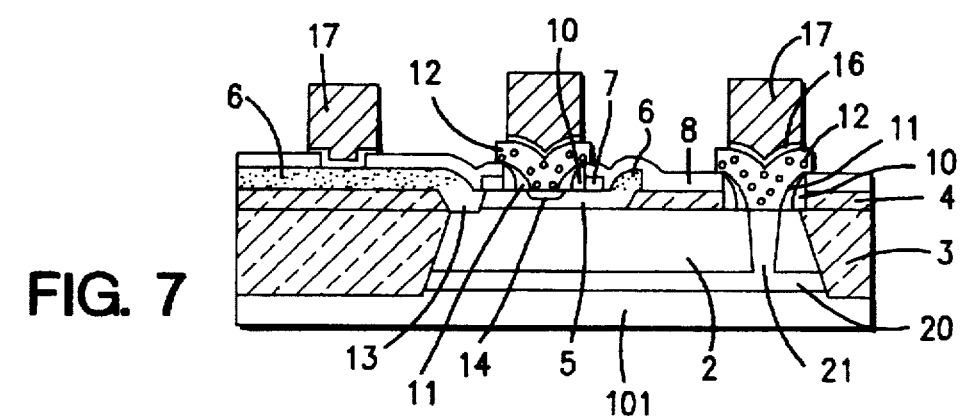
FIG. 7 is a fragmentary cross sectional elevation view illustrative of a novel bipolar transistor with an improved base region structure in a third embodiment according to the present invention.

A third embodiment of the present invention will be described with reference to FIG. 7 illustrative of a novel bipolar transistor with an improved base region structure. A structural difference of the bipolar transistor of the third embodiment from that of the first embodiment is as follows. An $n^+$-type buried layer 20 is formed over a p-type silicon substrate 101. An $n^-$-type epitaxial layer 2 serving as a collector region is formed over the $n^+$-type buried layer 20. The $n^+$-type buried layer 20 is plugged out to a surface of the substrate via an $n^+$-type collector plug region 21 on which an $n^+$-type polysilicon film 12 is formed.

A fabrication method for the above novel bipolar transistor with an improved base region structure will be described with reference to FIGS. 8A through 8Q.

Figure 8A:
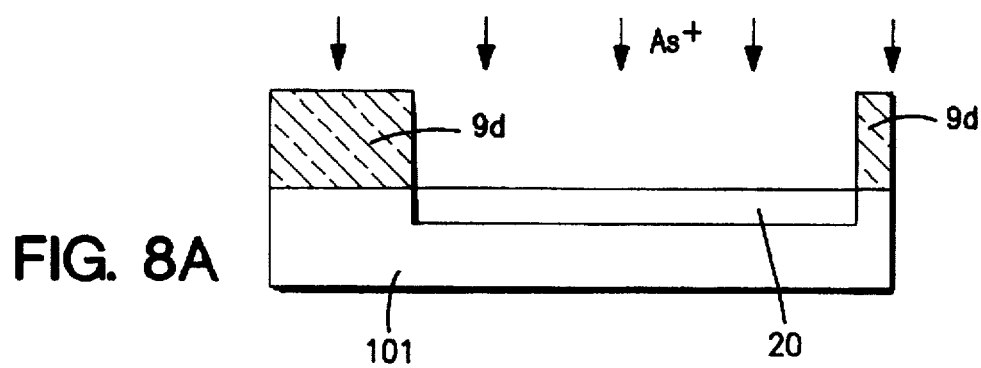
FIGS. 8A through 8Q are fragmentary cross sectional elevation views illustrative of a novel bipolar transistor with an improved base region structure in a third embodiment according to the present invention.

With reference to FIG. 8A, a photo-resist film 9d is formed to selectively cover a p-type silicon substrate 101 so that the photo-resist film 9d is used as a mask for ion-implantation of n-type impurity to form an $n^+$-type buried layer 20. Otherwise, an insulation film is formed over the substrate except on the active region so that the $n^+$-type buried layer 20 is formed by a thermal diffusion method before the insulation film is removed.

Figure 8B:
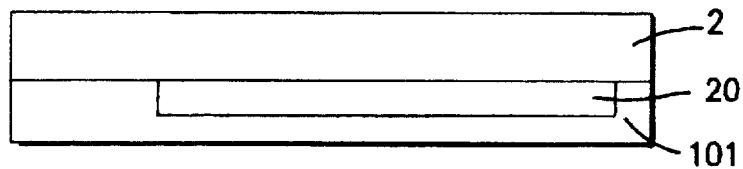

With reference to FIG. 8B, an $n^-$-type epitaxial layer 2 is grown by a molecular beam epitaxy.

Figure 8C:
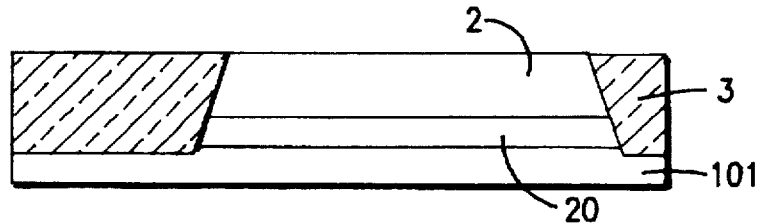

With reference to FIG. 8C, a field oxide film 3 is formed by a sport local oxidation of silicon method.

Figure 8D:
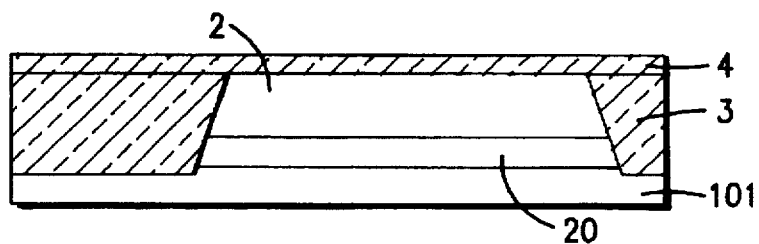

With reference to FIG. 8D, a surface oxide film 4 is formed by a thermal oxidation.

Figure 8E:
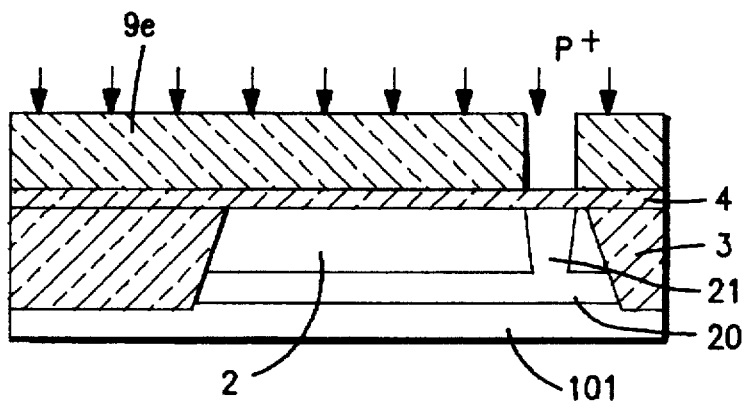

With reference to FIG. 8E, a photo-resist film 9e is used as a mask for ion-implantation of n-type impurity to form $n^+$-type collector plug region 21.

Figure 8F:
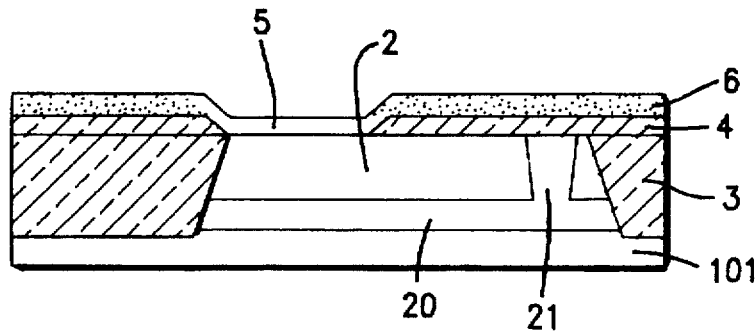

With reference to FIG. 8F, the surface oxide film 4 is selectively removed by a photo-lithography and an anisotropic etching to form an opening on the base formation region. A p-type epitaxial layer 5 is grown by a silicon molecular beam epitaxy system wherein a p-type epitaxial layer serving as a base region and a p-type polysilicon layer 6 serving as a base plug lead are simultaneously formed over the n⁻-type epitaxial layer 2 and the surface oxide film 4 respectively.

Figure 8G:
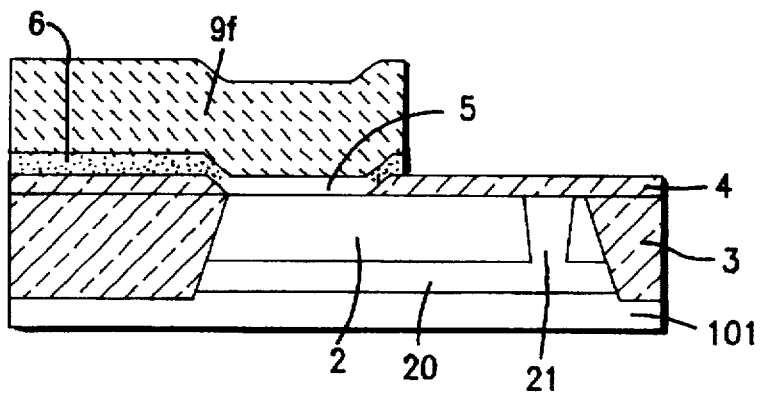

With reference to FIG. 8G, a photo-resist film 9f is formed to be used as a mask for an anisotropic etching to selectively remove the p-type polysilicon film 6 in the vicinity of the collector electrode formation region.

Figure 8H:
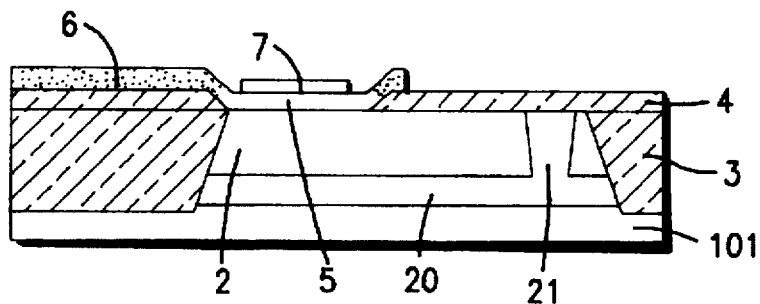

With reference to FIG. 8H, a silicon oxide film 7 is deposited by a chemical vapor deposition method before the silicon oxide film 7 is removed by a photo-lithography and an anisotropic etching to leave the silicon oxide film 7 only within the base region.

Figure 8I:
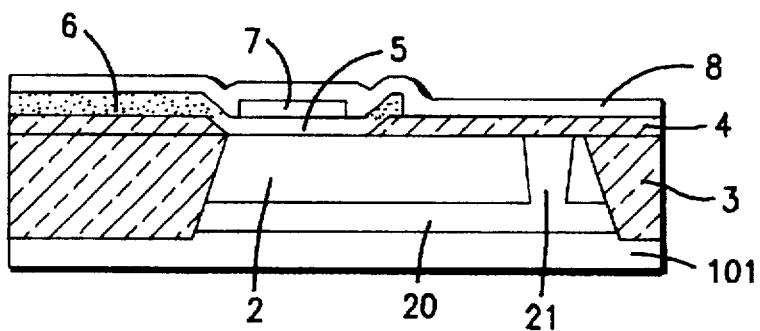

With reference to FIG. 8I, a boron silicate glass film 8 is formed on an entire surface of the wafer.

Figure 8J:
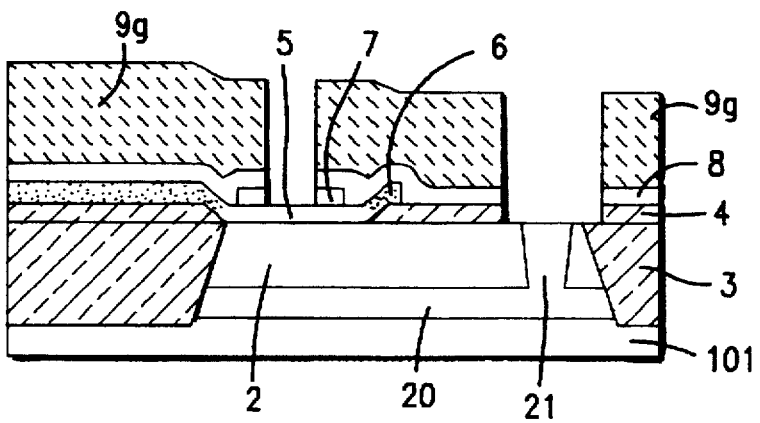

With reference to FIG. 8J, by a photo-lithography method and an anisotropic etching, the boron silicate glass film 8 and the silicon oxide film 7 are removed from the emitter formation region as well as the boron silicate glass film 8 and the surface oxide film 4 are removed from the collector contact formation region.

Figure 8K:
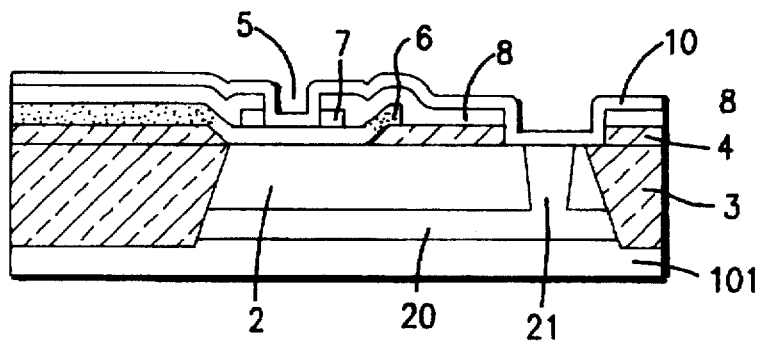

With reference to FIG. 8K, a silicon oxide film 10 is deposited on an entire surface of the wafer by a chemical vapor deposition.

Figure 8L:
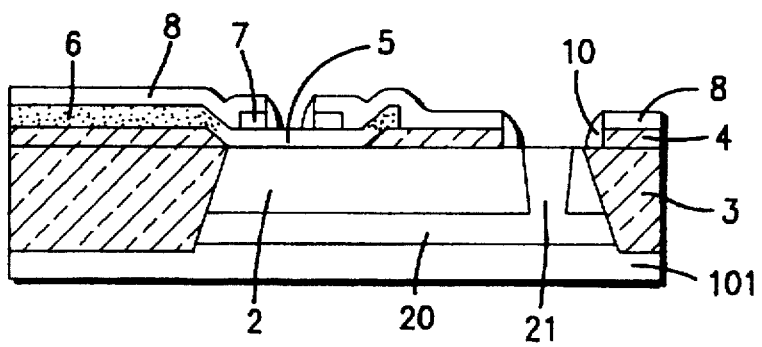

With reference to FIG. 8L, by an anisotropic etching, an etch-back to the silicon oxide film 10 is carried out. A side wall of silicon oxide is formed in an peripheral portion and a collector contact peripheral portion.

Figure 8M:
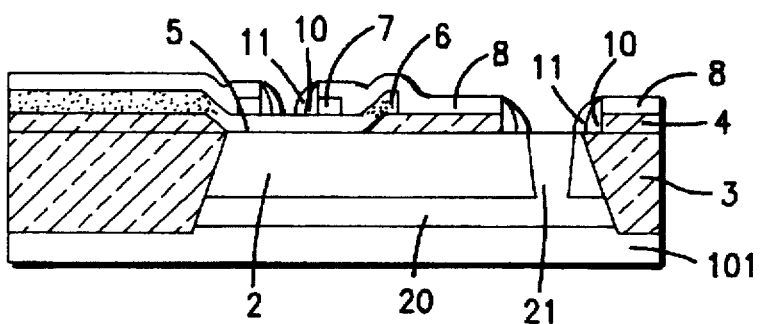

With reference to FIG. 8M, a silicon nitride film 11 is deposited on an entire surface of the wafer for subsequent etch-back thereto by use of an anisotropic etching to form the side wall of the silicon nitride film 11 at the peripheral portion of the emitter contact and the peripheral portion of the collector contact.

Figure 8N:
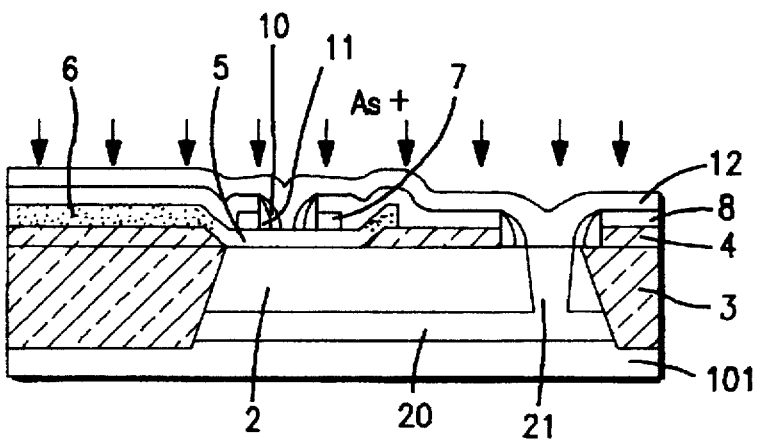
Figure 8P:
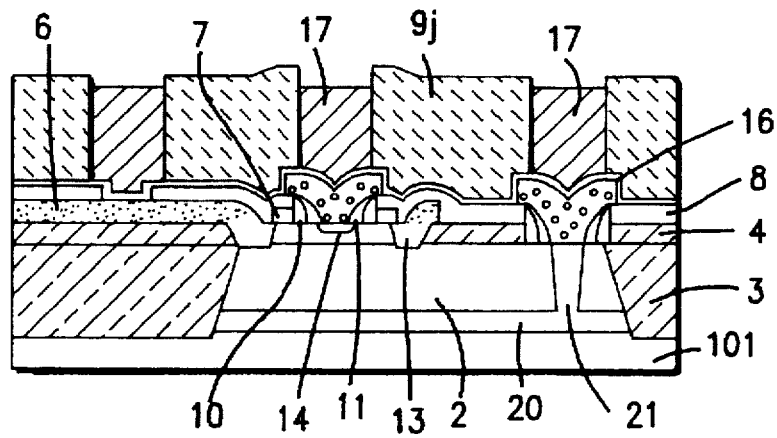

With reference to FIG. 8N, a polysilicon film 12 is deposited by a chemical vapor deposition method for subsequent ion-implantation of n-type impurity into the polysilicon film 12.

Figure 8O:
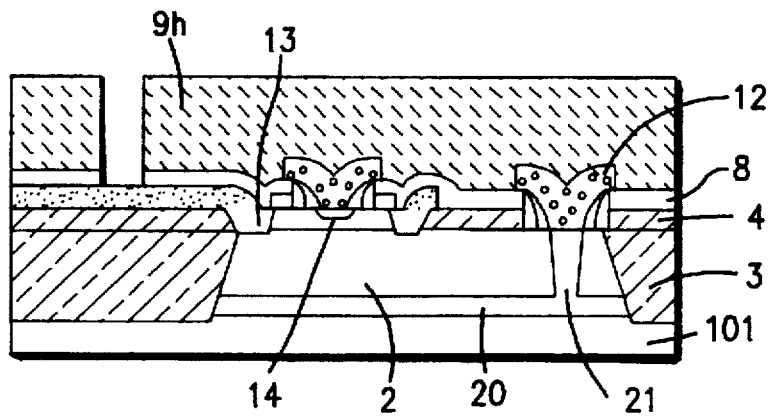
Figure 8Q:
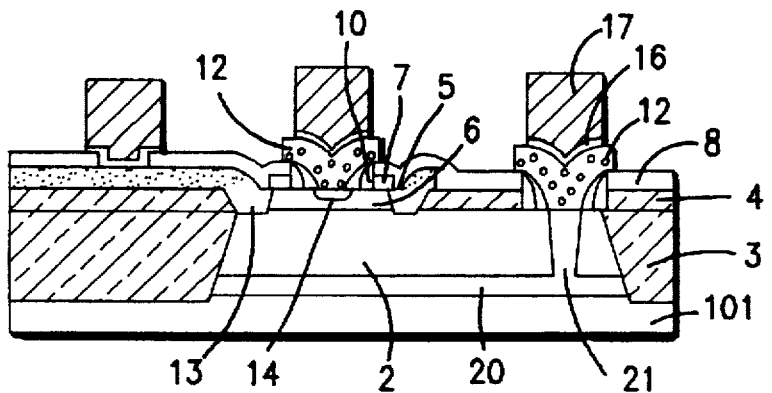

With reference to FIG. 8O, an annealing is carried out for activation of the n-type impurity in the n⁺-type polysilicon film 12 whereby the n-type impurity in the n⁺-type polysilicon film 12 is diffused into an upper portion of the p-type epitaxial base layer 5 to thereby form an n⁺-type emitter region 14. By this annealing, the boron silicate glass film 8 is made into the same film as the silicon oxide film. Further, a diffusion of the p-type impurity into the -type polysilicon film 6 is caused to reduce the sheet resistance of the p-type polysilicon film 6. Furthermore, a diffusion of p-type impurity from the p-type polysilicon film 6 is caused whereby a p⁺-type layer 13 is formed in the base region. The polysilicon film 12 is selectively removed by a photo-lithography and an anisotropic etching to form an emitter plug of the polysilicon film 12. A photo-resist film 9h is formed by a photo-lithography for subsequent anisotropic etching to selectively remove the boron silicate glass film 8 from the base lead contact portion.

As a modification, it is possible that the polysilicon film 12 is etched before the annealing process is carried out.

With reference to FIG. 8P, the photo-resist film 9h is removed before a barrier metal film 16 is evaporated on an entire surface of the wafer to form a photo-resist film 9i except on the predetermined electrode formation regions so that electrodes 17 are formed by a plating method.

With reference to FIG. 5Q, the photo-resist film 9i is removed for subsequent anisotropic etching by use of the electrodes 17 as masks to selectively remove the barrier metal layer 16 except under the electrodes whereby the fabrication processes are completed.

As descried above, in accordance with the present invention, it is not necessary to carry out any process under any strict control to the process conditions, for which reason it is possible to suppress variations in dimension or size of the base region structure and other regions or layers, resulting on a high yield being obtained.

The base region and the base plug lead are unitary and simultaneously formed, for which reason it is not necessary to form a base contact in the base region. This makes it possible to reduce the size of the base region, resulting in an improvement in high frequency performance of the bipolar transistor.

The base region 5 and the base plug lead are unitary and simultaneously formed and the boron phosphate glass film supplies the -type impurity into the base plug lead 6, resulting in a reduction in the number of the photo-lithography processes as compared to the conventional one. This allows a reduction in the manufacturing cost and time for the bipolar transistor.

As a modification, the base region may be made of SiGe in place of Si in order to obtain a further improvement in the high speed performance.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A base region structure of a bipolar transistor, the base region structure being formed over both an epitaxial layer having a first conductivity type and an insulation film, the base region structure comprising a continuous single layer of material having a second conductivity type, the continuous single layer of material comprising both an epitaxial portion extending over the epitaxial layer and a polycrystal portion extending over the insulation film, an emitter region being formed at an upper part of the epitaxial portion, the epitaxial portion serving as a base region and the polycrystal portion serving as a base plug lead.

2. The base region structure as claimed in claim 1, wherein the polycrystal portion has a higher impurity concentration than the epitaxial portion.

3. The base region structure as claimed in claim 1, wherein the base region is made of Si.

4. The base region structure as claimed in claim 1, wherein the base region is made of SiGe.

* * * * *